(12) United States Patent
Osipov et al.

(10) Patent No.: US 7,094,610 B2
(45) Date of Patent: Aug. 22, 2006

(54) MAGNETIC SENSOR BASED ON EFFICIENT SPIN INJECTION INTO SEMICONDUCTORS

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 69 days.

(21) Appl. No.: 10/879,649

(22) Filed: Jun. 28, 2004

(65) Prior Publication Data

US 2004/0233587 A1 Nov. 25, 2004

Related U.S. Application Data

(62) Division of application No. 10/284,360, filed on Oct. 31, 2002, now Pat. No. 6,809,388.

(51) Int. Cl.
*H01L 29/76* (2006.01)
*G11C 11/34* (2006.01)
(52) U.S. Cl. ............... 438/3; 257/421; 257/75; 365/158; 365/171; 365/175
(58) Field of Classification Search ........... 257/75, 257/295, 421; 365/158, 171, 175; 324/249; 438/3; 360/324.1
See application file for complete search history.

(56) References Cited

U.S. PATENT DOCUMENTS 5,416,353 A * 5/1995 Kamiguchi et al. ......... 257/421
5,654,566 A   8/1997 Johnson
6,285,581 B1 * 9/2001 Tehrani et al. ............... 365/173

OTHER PUBLICATIONS

Albrecht et al. cond-mat/0110059, (Feb. 7, 2002) (a publication of ArXiv.org available at http://arXiv.org/PS_cache/cond-mat/pdf/0202/0202131.pdf.arXiv.org is owened, operated and funded by Cornell University).*

Albrecht, J.D. et al, "Electron Spin Injection at a Schottky Contact" cond-mat/0110059, (a publication of ArXiv.org, available at http://arHiv.org/PS_ cache/cond-mat/pdf/0202/0202131.pdf.arHiv.org is owened, operated and funded by Cornell University) (Feb. 7, 2002).

Zhu, H.J. et al., "Room Temperature Spin Injection from Fe into GaAs" Phys. Rev. Lett. vol. 87, No. 1, pp. 016601.1 to 016601-4 (Jul. 2, 2001).

* cited by examiner

*Primary Examiner*—Thomas L. Dickey

(57) ABSTRACT

A magnetic sensor using efficient injection of spin polarized electrons at room temperature can be fabricated by forming a semiconductor layer sandwiched between ferromagnets and forming δ-doped layers between the semiconductor layer and the ferromagnets. A sensing method applies a magnetic field to be measured to the semiconductor layer and observes the conductivity of the sensor. The sensing techniques can achieve high magneto-sensitivity and very high operating speed, which in turn provides ultra fast and sensitive magnetic sensors.

15 Claims, 14 Drawing Sheets

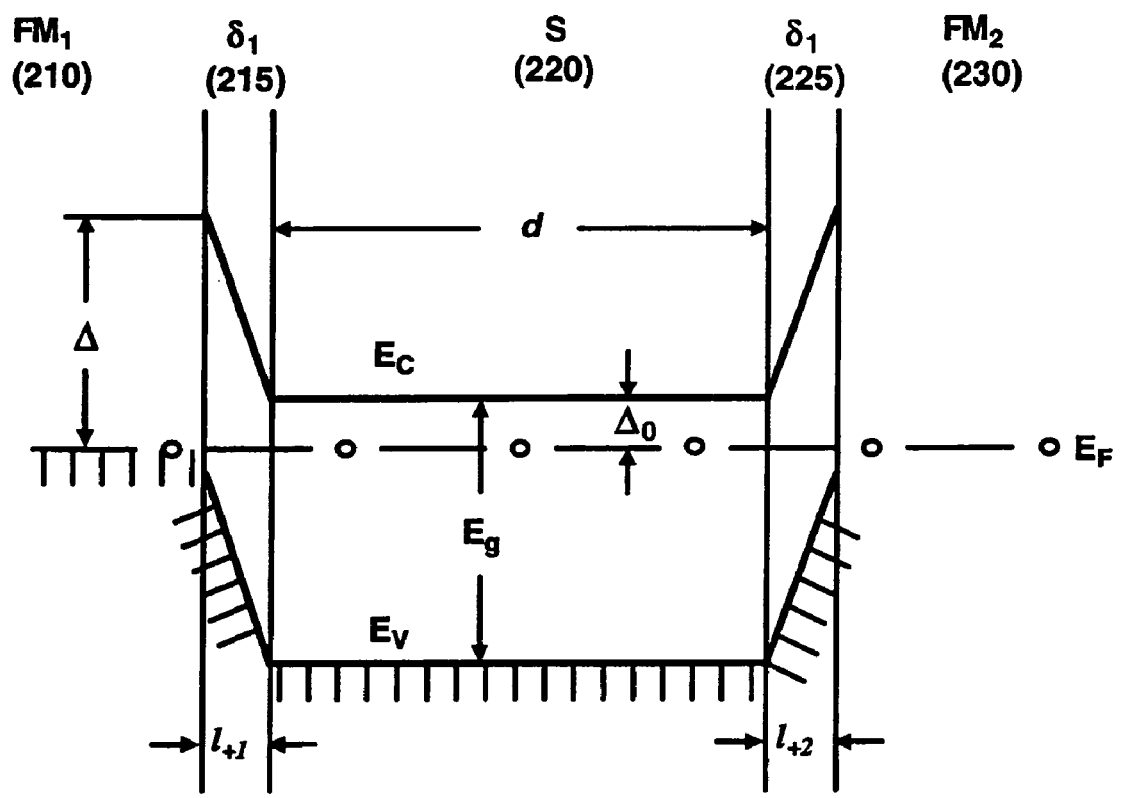
FIG. 3A1

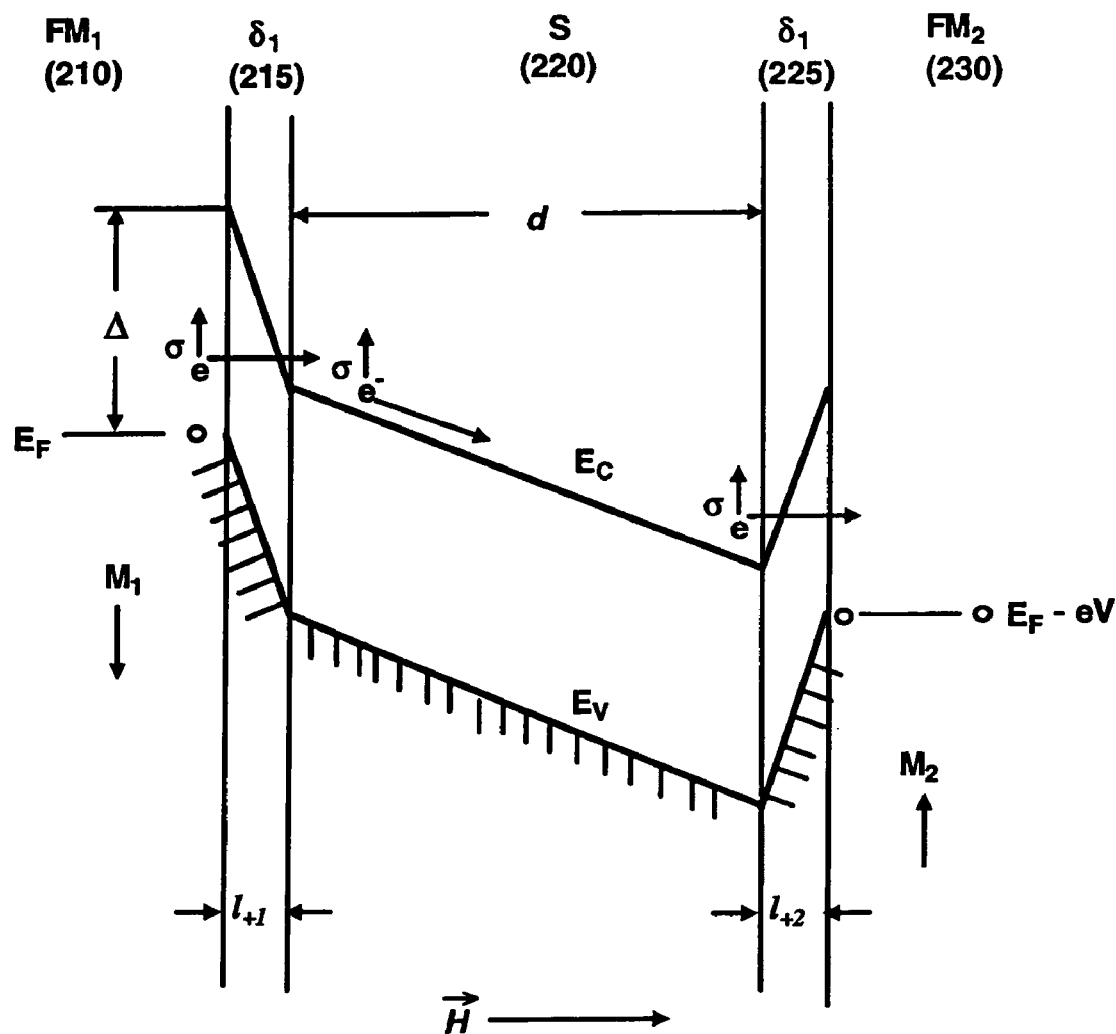
FIG. 3A2

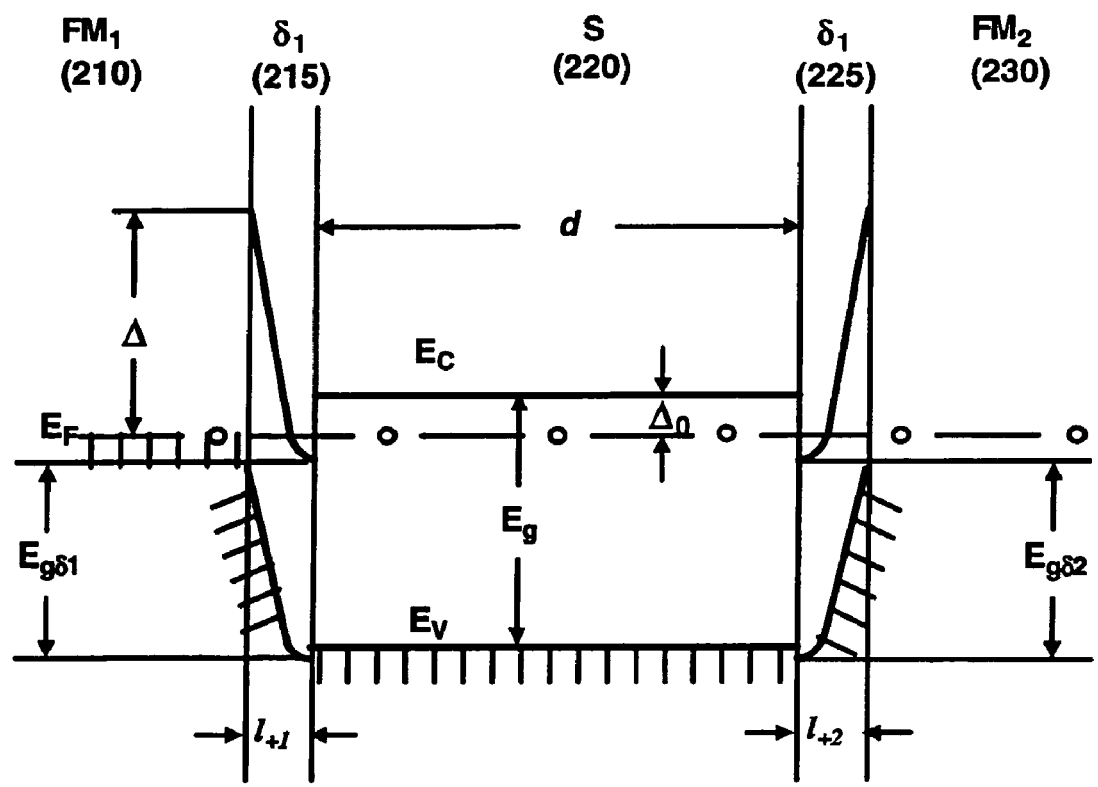
FIG. 3B1

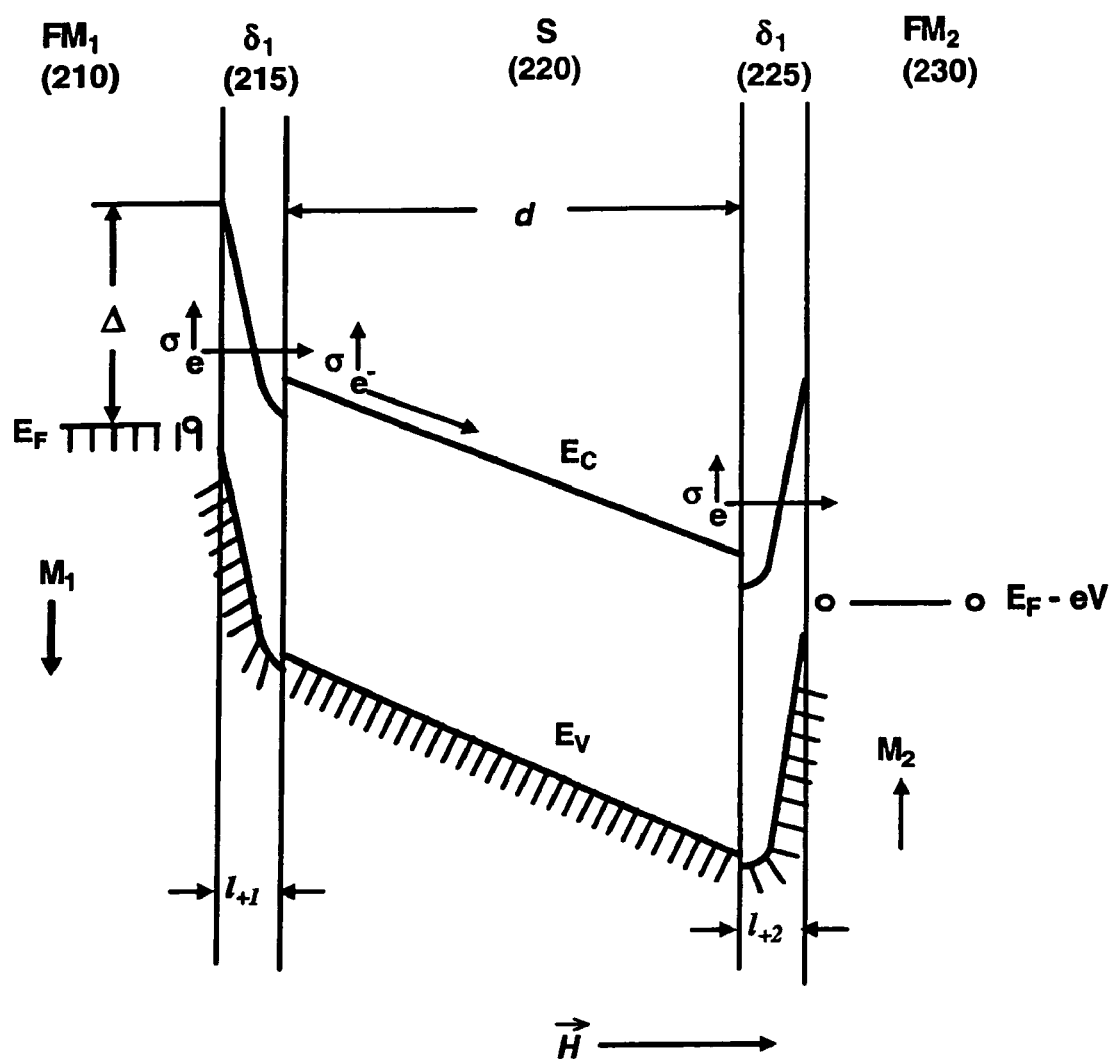
FIG. 3B2

| AFM₂ | |
|---|---|
| | 280 |

| FM₂ | |
|---|---|
| | 230 |

| δ₁ | 225 |

| S | |
|---|---|
| | 220 |

| δ₂ | 215 |

| FM₁ | |
|---|---|
| | 210 |

| AFM₁ | |
|---|---|
| | 240 |

FIG. 6C

MAGNETIC SENSOR BASED ON EFFICIENT SPIN INJECTION INTO SEMICONDUCTORS

CROSS-REFERENCE TO RELATED APPLICATIONS

This patent document is a continuation and claims benefit of the earlier filing date of U.S. patent application Ser. No. 10/284,360, filed Oct. 31, 2002 now U.S. Pat No. 6,809,388, which is hereby incorporated by reference in its entirety.

U.S. patent application Ser. No. 10/284,183, entitled "Efficient Spin Injection Into Semiconductors", which has a common assignee and is hereby incorporated by reference in its entirety, may contain some common disclosure and may relate to the present invention.

FIELD OF THE INVENTION

This invention relates generally to spintronics. In particular, the invention relates generally to a magnetic sensor, a magnetic read nanohead, based on efficient room temperature injection of spin polarized electrons into semiconductors and rotation of their spin under action of a magnetic field.

BACKGROUND OF THE INVENTION

Over the past decade a pursuit of solid state ultra fast scaleable devices, such as magnetic sensors of nanosize proportions, based on both the charge and spin of an electron has led to a development of new fields of magnetoelectronics and spintronics. The discovery of giant magnetoresistance (GMR) in magnetic multilayers has quickly led to important applications in storage technology. GMR is a phenomenon where a relatively small change in magnetism results in a large change in the resistance of the devices.

The phenomenon of a large tunnel magnetoresistance (TMR) of ferromagnet-insulator-ferromagnet structures is a focus of product development teams in many leading companies. TMR is typically observed in F1-I-F2 structures made of two ferromagnetic layers, F1 and F2, of similar or different materials separated by the insulating thin tunnel barrier 1 with thickness typically ranging between 1.4–2 nm. The tunnel current through the structure may differ significantly depending on whether the magnetic moments are parallel (low resistance) or anti parallel (high resistance). For example, in ferromagnets such as Ni80Fe20, Co—Fe, and the like, resistance may differ by up to 50% at room temperature for parallel (low resistance) versus antiparallel (high resistance) moments on ferromagnetic electrodes.

It is worth mentioning recent studies of the giant ballistic magnetoresistance of Ni nanocontacts. Ballistic magnetoresistance is observed in Ni and some other nanowires where the typical cross-section the nanocontacts of the nanowire is a few square nanometers. The transport in this case is through very short constriction and it is believed to be with conservation of electron momentum (ballistic transport). The change in the contact resistance can be close to 10 fold (or about 1000%).

All magnetic sensors proposed and developed to present day, including the read heads, are based on variations of magnetic configurations, domain structures, in ferromagnets under externally applied magnetic fields. This mechanism does not ensure operating speed and sensitivity required of ultra fast sensors.

Interest has been particularly been keen on the injection of spin-polarized carriers, mainly in the form of spin-polarized electrons into semiconductors. This is large due to relatively large spin-coherence lifetime of electrons in semiconductors, possibilities for use in ultra fast devices. One such device in the works is an ultra fast and sensitive magnetic sensor such as a magnetic read head.

The possibility of spin injection from ferromagnetic semiconductors (FMS) into nonmagnetic semiconductors has been demonstrated in a number of recent publications. However, the Curie temperature (the temperature above which a material becomes non-magnetic) of magnetic semiconductors is substantially below room temperature. The low Curie temperature limits possible applications. Room-temperature spin injection from ferromagnets (FM) into semiconductors also has been demonstrated, but it remains a difficult task and the efficiency is very low. The low spin injection efficiency makes it very difficult, if not impossible, to develop an ultra fast magnetic sensor operable at room temperature.

SUMMARY OF THE INVENTION

According to an embodiment of the present invention, a magnetic sensor includes first and second ferromagnetic layers, a semiconductor layer formed between the first and second ferromagnetic layers, a first δ-doped layer formed between the first ferromagnetic layer and the semiconductor layer, and a second δ-doped layer formed between the second ferromagnetic layer and the semiconductor layer.

BRIEF DESCRIPTION OF THE DRAWINGS

Features of the present invention will become known from the following description with reference to the drawings, in which:

FIGS. 3A1 and 3A2 illustrate an exemplary diagram of the magnetic sensors shown in FIGS. 2A and 2B at equilibrium and under bias, wherein the first and second δ-doped layers are both formed by heavily doping portions of the semiconductor layer;

FIGS. 3B1 and 3B2 illustrate an exemplary diagram of the magnetic sensors shown in FIGS. 2A and 2B at equilibrium and under bias, wherein the first and second δ-doped layers both have energy band gaps that are less than the energy band gap of the semiconductor layer;

FIGS. 6A–6D illustrate an exemplary method of manufacturing the sensor shown in FIG. 2B.

DETAILED DESCRIPTION

For simplicity and illustrative purposes, the principles of the present invention are described by referring mainly to exemplary embodiments thereof. In the following description, numerous specific details are set forth in order to provide a thorough understanding of the present invention.

However, the present invention may be practiced without limitation to these specific details. In other instances, well known methods and structure have not been described in detail so as not to unnecessarily obscure the present invention.

Figure 1A:
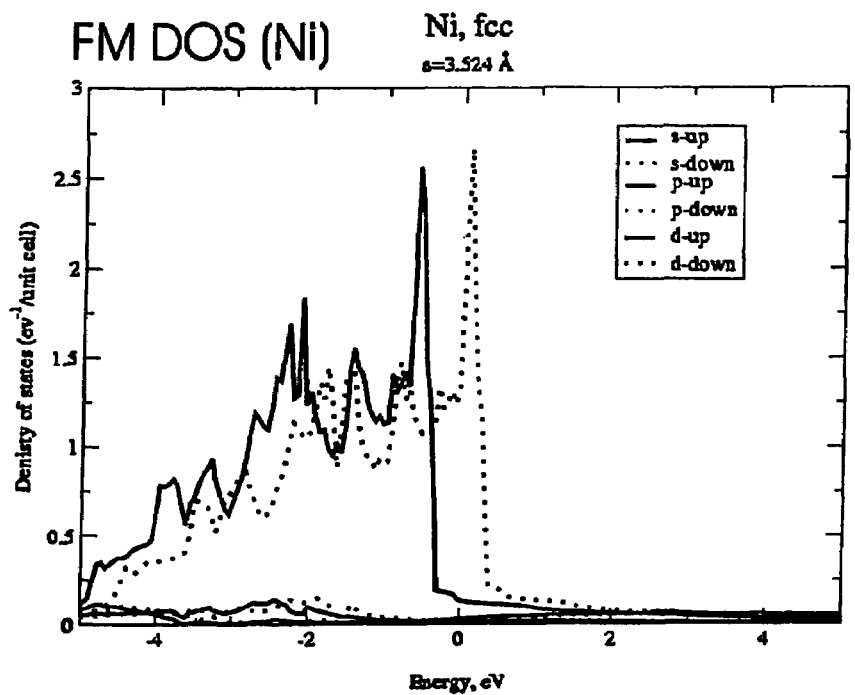
FIG. 1A illustrates a density of electronic states (DOS) of ferromagnetic Ni.

The density of states ("DOS") is one of main characteristics of electrons in solid states, in particular, in magnetic materials, such as ferromagnetic Ni, Co, and Fe. DOS is referred to as g(E)dE), which is the number of electrons per unit volume in an energy interval (E,E+dE). FIG. 1A illustrates the DOS in ferromagnetic Ni, where arrows indicate the DOS for majority (spin up ↑) and minority (spin down ↓) electrons. Note that the DOS have high peaks for both spin-up and spin-down electrons at certain energy intervals.

Figure 1B:
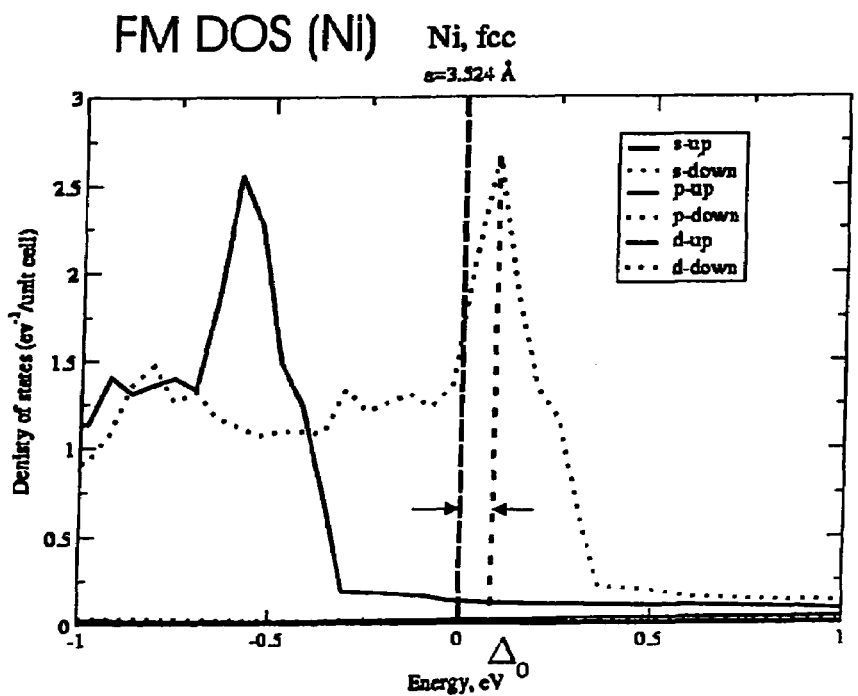
FIG. 1B illustrates the density of electronic states (DOS) of ferromagnetic Ni, but at a higher resolution than in FIG. 1A.

FIG. 1B illustrates the density of electronic states (DOS) of ferromagnetic Ni, but at a higher resolution than in FIG. 1A. The energy origin is chosen at the Fermi level $E_F$, i.e., $E=E_F=0$. As shown, there is a very large difference in the density of states of minority and majority d-electrons at E>0 (states above the Fermi level). The peak in the DOS of minority d-electron states is positioned at $E=\Delta_0$, which for Ni, $\Delta_0 \approx 0.1$ eV. Similar region at E>0 exists in Co and Fe. Note that near $E \approx \Delta_0$, the DOS of the majority d-electrons and DOS of s and p electrons are all negligible when compared the DOS of minority d-electrons. Thus, if electrons are injected from the ferromagnetic material with energies $E \approx \Delta_0$, the electrons would be almost 100% polarized.

Figure 2A:
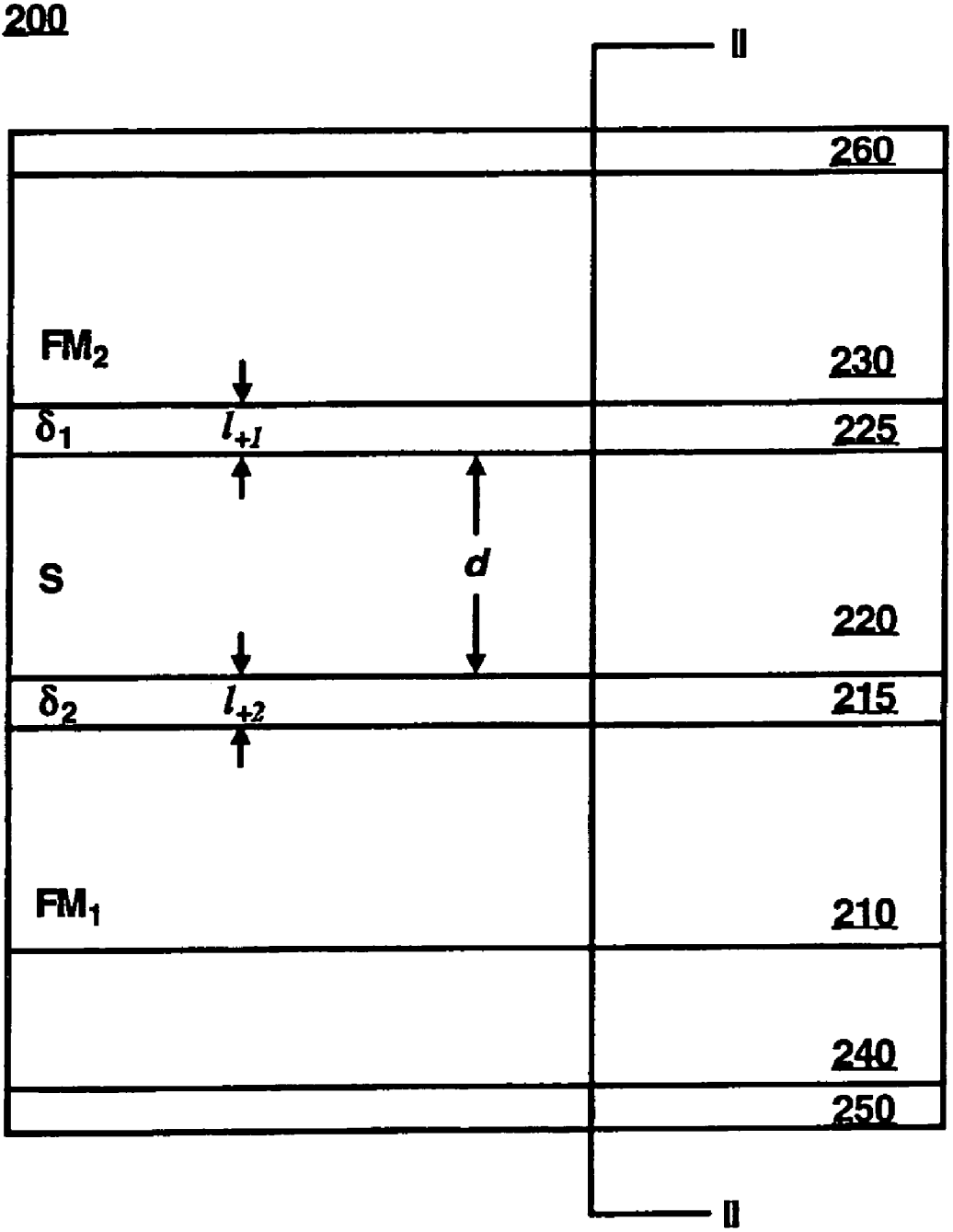
FIG. 2A illustrates an exemplary magnetic sensor according to an embodiment of the present invention.

FIG. 2A illustrates an exemplary magnetic sensor 200 according to an embodiment of the present invention. As shown, the sensor 200 may include first and second ferromagnetic layers 210 and 230, respectively, and a semiconductor layer 220 formed therebetween. The sensor 200 may also include first and second δ-doped layers 215 and 225, which are located between the first ferromagnetic layer 210 and the semiconductor layer 220 and between the semiconductor layer 220 and the second ferromagnetic layer 230, respectively. The sensor 200 may further include a substrate 240, preferably a metal, formed below the first ferromagnetic layer 110.

In addition, the sensor 200 may include electrodes 260 and 250 electrically connecting, respectively, to the ferromagnetic layer 230 and the ferromagnetic layer 210 or the metal substrate 240. The electrodes 260 and 250 are not strictly necessary because the ferromagnetic layers 210 and 230 may directly play the role of electrodes.

The first and second ferromagnetic layers 210 and 230 may each be formed from various magnetic materials, preferably Ni, Fe and Co, as well as various magnetic alloys, which may include one or a combination of Fe, Co, Ni. The semiconductor layer 220 may be formed from various semiconductor materials including Si, Ge, GaAs, ZnTe, GaSb, GaP, InAs, CdSe, InP, InSb, CdTe, CdS, ZnS, ZnSe, AlP, AlAs, AlSb and also alloys and combinations of these materials. In general, it is preferred that the semiconductor layer 220 be formed from materials with relatively large time of electron spin relaxation $\tau_S$ (as will be shown below) such as GaAs, Ge, ZnSe and ZnCdSe. The semiconductor layer 220 is also preferred to be negatively doped.

Donor concentrations $N_{d1}$, and $N_{d2}$ of the first and second δ-doped layer 215 and 225 are preferred to be greater than the donor concentration $N_s$ of the semiconductor layer 220, i.e., $N_{d1}, N_{d2} >> N_s$ should hold. In one embodiment, one or both of the first and second δ-doped layers 215 and 225 may be formed by heavily doping of portions of the semiconductor layer 220 with electron rich materials. The magnetic sensor 200 thus formed may be described as having a FM-n$^+$-n-n$^+$-FM structure. Examples of electron rich materials include P, As, and Sb, which are typically used to dope semiconductors Ge and Si, and Ge, Se, Te, Si, Pb and Sn, which are typically used to dope semiconductor GaAs.

The inventors have discovered that if the following conditions are satisfied, efficient spin-injection of current from the ferromagnetic layers 210 and 230 into the semiconductor layer 220 may take place at room temperature:

$$N_{d1}l_{+1}^2 \approx 2\frac{\varepsilon_0\varepsilon(\Delta-\Delta_0)}{q^2}, \qquad N_{d2}l_{+2}^2 \approx 2\frac{\varepsilon_0\varepsilon(\Delta-\Delta_0)}{q^2} \qquad (1)$$

$$l_{+1} \le t_0 = \sqrt{\frac{\hbar^2}{2m^*(\Delta-\Delta_0)}}, \qquad l_{+2} \le t_0 = \sqrt{\frac{\hbar^2}{2m^*(\Delta-\Delta_0)}} \qquad (2)$$

where $N_{d1}$ and $N_{d2}$ represent donor concentrations of the first and second δ-doped layers 215 and 225, respectively; $l_{+1}$ and $l_{+2}$ represent the thicknesses of the first and second δ-doped layers 215 and 225, respectively; $\varepsilon_0$ represents the permittivity of free space; $\varepsilon$ represents a relative permittivity of the semiconductor layer 220; $\Delta$ represents a height of the Schottky barrier (as measured from the Fermi level of the ferromagnetic layers 210 and 230) on the boundaries between the first ferromagnetic layer 210 and the first δ-doped layer 215 and between the second ferromagnetic layer 230 and the second δ-doped layer 225; $\Delta_0$ represents the height of the lower and wider potential barrier in the semiconductor layer 220 (also as measured from Fermi level of the ferromagnetic layers 210 and 230); q represents elementary charge; and $\hbar$ is the Planck's constant. For GaAs semiconductor layer, $m^* \approx 07\ m_0$ where $m_0$ is the mass of free electron and $t_0 \approx 1$ nm. Similarly for Si, the corresponding values are $\approx 0.2\ m_0$ and $\approx 0.5$ nm, respectively.

Under the conditions of Equations (1) and (2), the δ-doped layers 215 and 225 become "transparent" for tunneling electrons. In other words, electrons with energy $E \ge \Delta_0$ may easily traverse the δ-doped layers 215 and 225.

As noted above, when the barrier height $\Delta_0$ corresponds to the peak in the DOS for minority d ↓ electrons in the ferromagnetic layers 210 and 230 (see FIGS. 1A and 1B), the electrons are almost 100% polarized. In other words, $P_1$ and $P_2$ are both almost unity, where $P_1$ and $P_2$ represent degrees of polarization of injected electrons from the first ferromagnetic layer 210 to the semiconductor layer 220, the first FM-S interface, and from the second ferromagnetic layer 230 to the semiconductor layer 220, the second FM-S interface, respectively. It is preferred that the condition of Equation (1) is satisfied to the extent that a dispersion of $\Delta_0$ is equal to the width of the peak in DOS shown in FIGS. 1A and 1B. Typically, this occurs if Equation (1) is accurate within 20 percent.

In another embodiment, one or both of the first and second δ-doped layers 215 and 225 may be formed by growing a n$^+$-doped epitaxial layer on one or both sides of the n-doped semiconductor layer 220 (this structure may also be referred as a FM-n$^+$-n-n$^+$-FM heterostructure). It is preferred that the epitaxially grown δ-doped layers 215 and 225 be doped heavily as practicable and be as thin as practicable. Preferably, one or both of the first and second δ-doped layers 215 and 225 have a narrower energy band gap than the energy band gap of the semiconductor layer 220, i.e., $E_{g\delta1} < E_g$ and $E_{g\delta2} < E_g$ and at that electron affinities of the δ-doped layers 215 and 225 be greater than an electron affinity of the semiconductor layer 220 by a value close to $\Delta_0$.

If one or both of the first and second δ-doped layers 215 and 225 are formed by epitaxial growth of a very thin heavily doped (i.e., n⁺ doped) and narrower energy band gap semiconductor layer, the parameters of the layers 215 and 225, i.e., their respective donor concentrations $N_{d1}$ and $N_{d2}$ and their thicknesses $l_{+1}$ and $l_{+2}$ should satisfy the following conditions for efficient spin injection:

$$N_{d1} > 2\frac{\varepsilon_0 \varepsilon (\Delta - \Delta_0)}{q^2 l_{+1}^2}, \qquad N_{d2} > 2\frac{\varepsilon_0 \varepsilon (\Delta - \Delta_0)}{q^2 l_{+2}^2} \qquad (3)$$

$$l_{+1} \leq t_0, \; l_{+2} \leq t_0 \qquad (4)$$

Examples of such heterostructures include $FM_1$—GaAs—$Ga_{1-x}Al_xAs$—GaAs—$FM_2$ (i.e., n⁺-δ-doped layers are formed from GaAs and n-doped semiconductor layer is formed from $Ga_{1-x}Al_xAs$), $FM_1$—$Ge_xSi_{1-x}$—Si—$Ge_xSi_{1-x}$—$FM_2$, and $FM_1$—$Zn_{1-x}Cd_xSe$—$FM_2$, where x and 1−x quantities refer to the composition of the respective materials. Regarding the n⁺-δ-doped layers (e.g., GaAs, $Ge_xSi_{1-x}$ and $Zn_{1-x}Cd_xSe$), their thickness $l_{+1}$ and $l_{+2}$ should be sufficiently thin such that corresponding FM-S interfaces become transparent for electron tunneling. The conditions of Equations (3) and (4) may be satisfied, for example, if the δ-doped layers 215 and 225 are such that the thickness $l_{+1,2} \leq 1$ nm and the donor concentration $N_{d1,2}^+ \geq 10^{20}$ cm⁻³.

It is possible that one of the first and second δ-doped layers 215 and 225 are formed from heavily doping a portion of the semiconductor layer 220 and the other of the first and second δ-doped layers 215 and 225 be formed by epitaxial growth.

The substrate 240 may be formed preferably from metals such as Ta, Cu, Ag, Au, and Pl. In addition, the electrodes 250 and 260 may be formed from highly conductive materials such as metals, doped silicon, and doped polysilicon.

Figure 2B:
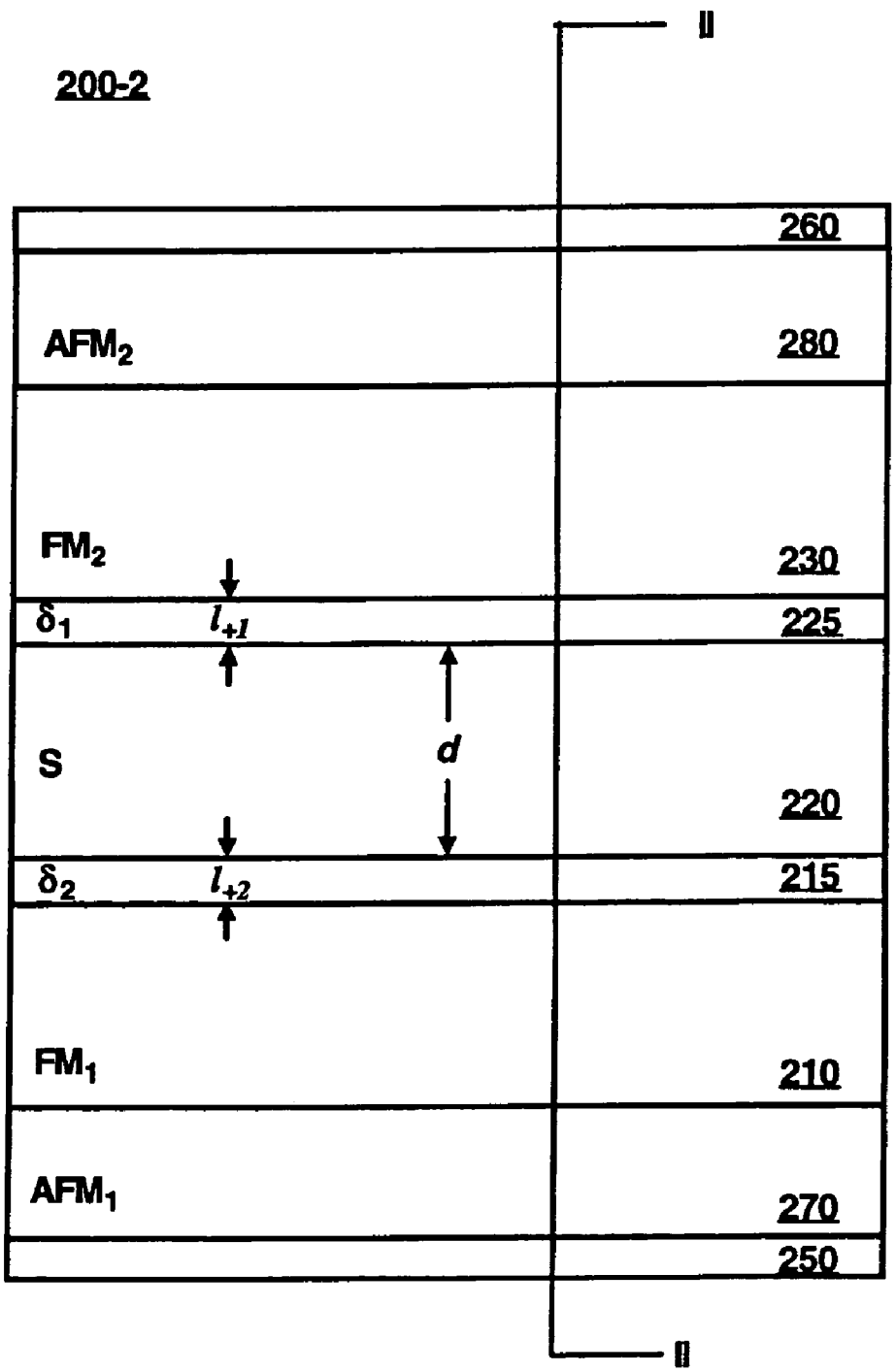
FIG. 2B illustrates an exemplary magnetic sensor according to another embodiment of the present invention.

FIG. 2B illustrates an exemplary magnetic sensor 200-2 according to another embodiment of the present invention. The sensor 200-2 is similar to the sensor 200 shown in FIG. 2A. The sensor 200-2 differs from the sensor 200 in that first and second antiferromagnetic layers 270 and 280 may be present. As shown in FIG. 2B, the first antiferromagnetic layers 270 may be placed between the first ferromagnetic layer 210 and electrode 250 and may play the role of the substrate. Similarly, the second antiferromagnetic layer 280 may be placed between the second ferromagnetic layer 230 and electrode 260. The antiferromagnetic layers 270 and 280 fix more rigidly magnetizations $M_1$ and $M_2$ within ferromagnetic layers 210 and 230, respectively. The first and second antiferromagnetic layers 270 and 280 may be formed from various materials including FeMn, IrMn, NiO, MnPt (L1₀), α-$Fe_2O_3$, and combinations therefrom.

FIGS. 3A1 and 3A2 illustrate an exemplary diagram of the magnetic sensor 200, 200-2 along the line II—II shown in FIGS. 2A and 2B at equilibrium (FIG. 3A1) and under bias (FIG. 3A2), wherein the first and second δ-doped layers 215 and 225 are both formed by heavily doping portions of the semiconductor layer 220.

FIGS. 3B1 and 3B2 illustrate an exemplary diagram of the magnetic sensor 200, 200-2 along the line IV—IV shown in FIGS. 2A and 2B at equilibrium (FIG. 3B1) and under bias (FIG. 3B2), wherein the first and second δ-doped layers 215 and 225 both have energy band gaps that are less than the energy band gap of the semiconductor layer 220.

With references to FIGS. 3A1–3B2, the operation of the magnetic sensors 200, 200-2 will be explained. First, under bias at room temperature, spin-polarized electrons from the first ferromagnetic layer 210 are injected into the semiconductor layer 220 through the first δ-doped layer 215 using the concept of efficient room temperature injection described above (see also below).

A potential Schottky barrier for electrons always forms at the boundary of any metal-semiconductor interface, such as at the boundary between the first ferromagnetic layer 210 and the first δ-doped layer 215. If the donor concentration $N_d$ is sufficiently high and the thickness $l_{+1}$ is sufficiently small, the first δ-doped layer 215 is "transparent" for tunneling electrons, and the electrons from the first ferromagnetic layer 210 may easily traverse the first δ-doped layer 215.

The electrons that tunnel through the first δ-doped layer 215 meet another lower and wider potential barrier formed in the semiconductor layer 220. It is preferred that the width d of the semiconductor layer 220 be wide enough. When this occurs, electrons with energies below the barrier height are effectively filtered, and essentially, only the electrons with energies above the barrier height $\Delta_0$ will be able to traverse the semiconductor layer 220.

It is preferred that the height of the barrier in the semiconductor layer 220 is approximately equal to $E_F + \Delta_0$ where $E_F$ is the Fermi level at equilibrium. Note that the potential barrier in the semiconductor layer 220 may be manipulated to a desired value by controlling the characteristics of the magnetic sensor 200, 200-2, for example by controlling the donor concentration $N_s$ of the semiconductor layer 220. As previously noted, the DOS of minority d ↓ electrons of a ferromagnet reaches maximum at energy level $E \approx E_F + \Delta_0$ (see FIGS. 1A and 1B). For simplicity, origin is chosen such that $E_F = 0$. Then the maximum DOS of minority d ↓ electrons exceeds, by more than an order of magnitude, the DOS of other type electrons (s ↑, s ↓, p ↑, p ↓ and d ↑) in the first ferromagnetic layer 210 at $E \approx \Delta_0$.

Thus, if the potential barrier height of the semiconductor layer 220 is such that it coincides with $\Delta_0$ then the electrons from the first ferromagnetic layer 210 tunneling through the first δ-doped layer 215 and traverse the length d of the semiconductor layer 220 will be composed of almost all minority d ↓ electrons. In other words, the injected current will be almost completely spin-polarized.

Further, the Δ height of the barrier is preferred to be substantially maintained throughout the width d of the semiconductor layer 220 at equilibrium (see FIGS. 3A1 and 3B1). The height of the barrier may be substantially maintained if the donor concentration $N_s$ and the width d of the semiconductor layer 220 substantially satisfy the following conditions:

$$N_s \leq 2\frac{\varepsilon_0 \varepsilon \Delta_0}{q^2 d^2} \qquad (5)$$

$$d > d_{\min} = a_B \left(\frac{1}{k_B T}\right) \sqrt{\frac{m_0 E_B \Delta_0}{m_e^*}} \qquad (6)$$

where $\alpha_B = 0.05$ nm and $E_B = 13.6$ eV are the Bohr parameters; $m_0$ is mass of free electron; T is the sensor temperature and $k_B$ is the Boltzmann constant. For example, $d_{min} \approx 6$ nm for GaAs and $d_{min} \approx 3$ nm for Ge when $\Delta_0 = 0.1$ eV and T=300K. Under these circumstances, if d>10 nm and $N^s \leq 10^7$ cm⁻³ the conditions specified by Equations (5) and (6) would be satisfied.

Due to the peculiarity of the DOS in the ferromagnet, the end result is that practically only the minority d ↓ electrons are injected from the first ferromagnetic layer 210 into the semiconductor layer 220. In other words, the degree of spin polarization $P_1$ of the injected electrons from the first ferromagnetic layer 210 into the semiconductor layer 220 is close to 1 (or close to unity). The same is true of the degree of spin polarization $P_2$ of electrons injected from the second ferromagnetic layer 230 into the semiconductor layer 220.

It is preferred that the electrons conserve their spin orientation during transit through the semiconductor layer 220, i.e., spin ballistic transport is desired. For spin ballistic transport to occur, a transit time $\tau_d$ of the electrons through of the semiconductor layer 220 of the width d should be substantially equal to or less than the spin-coherence time $\tau_S$ of the electrons in the semiconductor layer 220.

The transit time $\tau_d$ is determined by the diffusion and the drift of the electrons under the electrical field $\overline{E}$ inside the semiconductor layer 220 and is equal to $\tau_d = d/v_d$ where $v_d = \mu_n \overline{E} + D_n/d$, $\mu_n$ and $D_n$ are the mobility and the diffusion constant of the electrons. Thus, spin ballistic transport occurs when:

$$d < d_{max} = \sqrt{D_n \tau_S} \quad (7)$$

According to Equations (6) and (7), the width d of the semiconductor layer 220 should satisfy the following condition:

$$d_{min} = a_B \left(\frac{1}{k_B T}\right) \sqrt{\frac{m_0 E_B \Delta_0}{m_e^*}} < d < d_{max} = \sqrt{D_n \tau_S} \quad (8)$$

For typical parameters of Ge and GaAs, $d_{min} \approx 10^{-6}$ cm and $d_{max} \approx 3 \times 10^{-3}$ cm.

In comparison with earlier proposed magnetic sensors, the sensors 200, 200-2 shown in FIGS. 2A and 2B possess an additional degree of freedom resulting from spin rotation of the injected spin-polarized electrons under the action of an external magnetic field during transit through the semiconductor layer 220 in the spin ballistic transport, $\tau_d \leq \tau_S$.

The electron spin rotation occurs with frequency $\omega = \gamma H$ where $\gamma = 1.76 \times 10^7 \text{Oe}^{-1} \text{s}^{-1}$ is the gyromagnetic ratio and H is the magnetic field component normal to the spin (see FIG. 3A2). Thus, the angle of the spin rotation is $\theta H = \gamma H \tau_d$ and its maximum is $\theta_{Hmax} = \gamma H \tau_S$. Therefore, the total angle $\theta$ between the electron spin $\sigma$ and the magnetization $M_2$ of the second ferromagnetic layer 230 is $\theta = \theta_0 + \theta H$ where $\theta_0$ is the angle between the magnetizations $M_1$ and $M_2$ of the first and second ferromagnetic layers 210 and 230. The theoretical calculations and experimental studies show that the longest values for spin-coherence time $\tau_S$ can be realized in negative doped semiconductors (n-semiconductors) and can reach up to 1 ns in ZnSe and GaAs at room temperature. Hence it follows that $\theta = \pi$ can be obtained at H in several hundred Oersteds.

A conductivity G of the second FM-S interface, i.e., between the second ferromagnetic layer 230 and the semiconductor layer 220, change with the angle $\theta$ between the electron spin a and the magnetization $M_2$ of the second ferromagnetic layer 230. Note that the magnetic sensor 200-2 as shown in FIG. 2B has an advantage in that antiferromagnetic layers 270 and 280 may be used to fix magnetizations $M_1$ and $M_2$ of the first and second ferromagnetic layers 210 and 230, respectively. The conductivity G of the structures shown in FIGS. 2A and 2B may be written as:

$$G = G_0(1 + P_1 P_2 \cos\theta) \quad (9)$$

where $P_1$ and $P_2$ are degrees of polarizations first and second FM-S interfaces as described previously. It was also described above that the variation of the angle $\theta$ between the electron spin $\sigma$ and the magnetization $M_2$ inside the second ferromagnetic layer 230 can exceed $\pi$ when the magnetic field is several hundred Oersteds. Thus, the maximum magnetoresistance variation can reach:

$$\frac{G_{max}}{G_{min}} = \frac{1 + P_1 P_2}{1 - P_1 P_2} \quad (10)$$

As mentioned above, $P_1$ and $P_2$ for the sensors 200 and 200-2 shown in FIGS. 2A and 2B are nearly unity. Therefore, the variation of resistance of the magnetic sensor 200, 200-2 can reach several orders of magnitude. In other words, the magnetic sensors 200, 200-2 may be extremely sensitive.

Figure 4A:
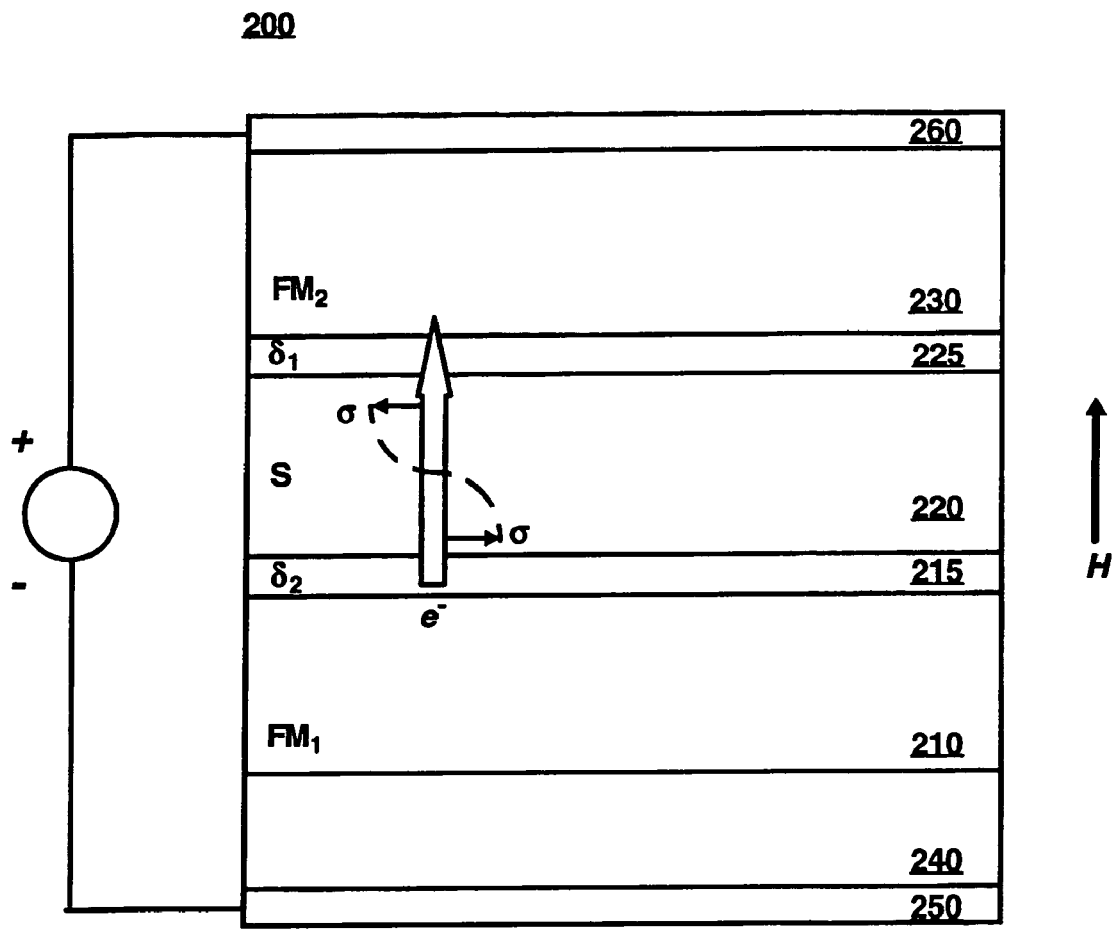
FIGS. 4A and 4B illustrate the embodiments of magnetic sensors shown in FIGS. 2A and 2B in operation.
Figure 4B:
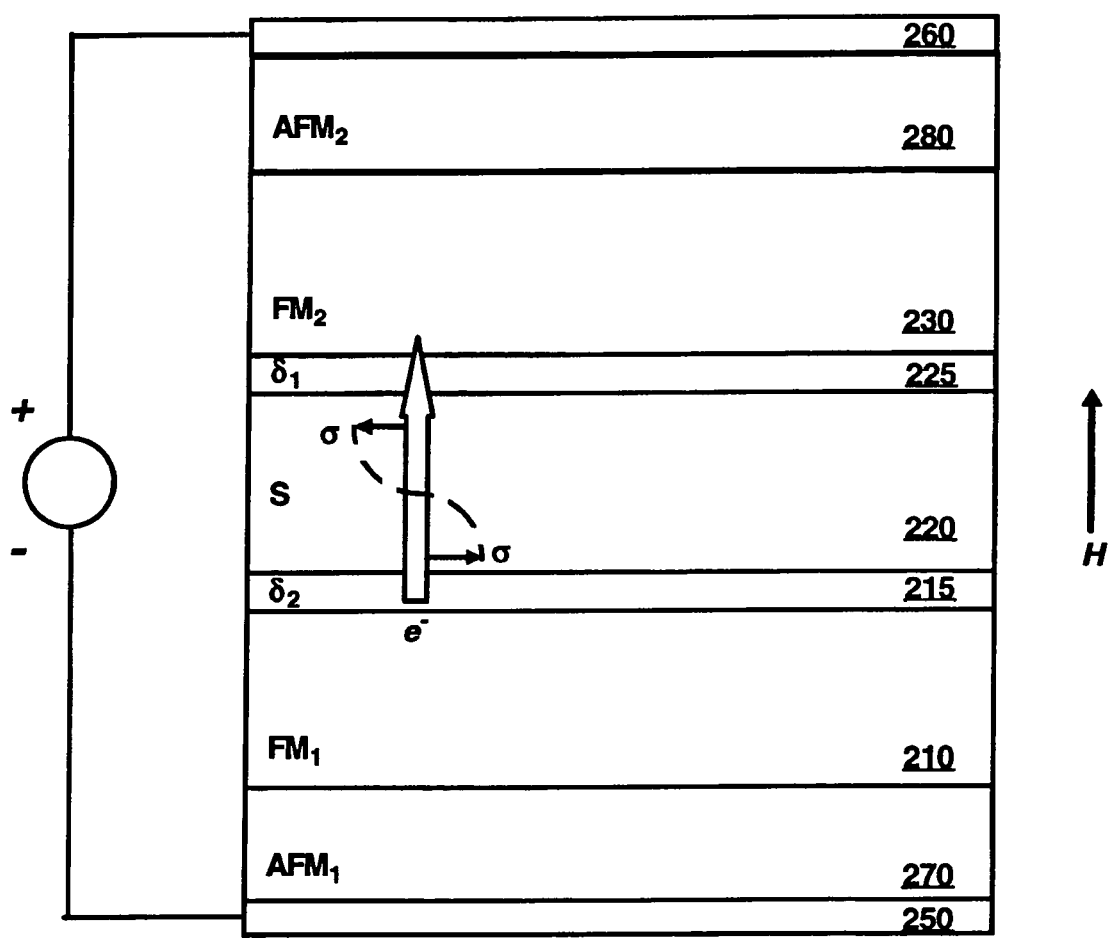

FIGS. 4A and 4B illustrate the embodiments of magnetic sensors 200 and 200-2 in operation. As shown, injection of spin-polarized electrons occurs from the first ferromagnetic layer 210 into the semiconductor layer 220. The electron spin is rotated under action of a magnetic field and it causes change in resistance of the second ferromagnetic layer 230, which is measured.

The magnetic sensors 200 and 200-2 may be ultra fast. It was noted above that the transit time $\tau_d$ is essentially less than or equal to the spin-coherence time $\tau_S$ of the electrons. It was also noted above that for n-doped semiconductor 220 the spin-coherence time $\tau_S$ can be less than or equal to 1 ns. This means that the transit time $\tau_d < \tau_S < 1$ ns. In other words, the effect of spin injection from the first ferromagnetic layer 210 and the spin rotation may manifest as a change in the resistance in the second ferromagnetic layer in less than 1 ns (or less than a billionth of a second). It should be noted that 1 ns is the maximum time at room temperature. Typically, $\tau_S = 0.1 - 0.01$ ns.

Figure 5A:
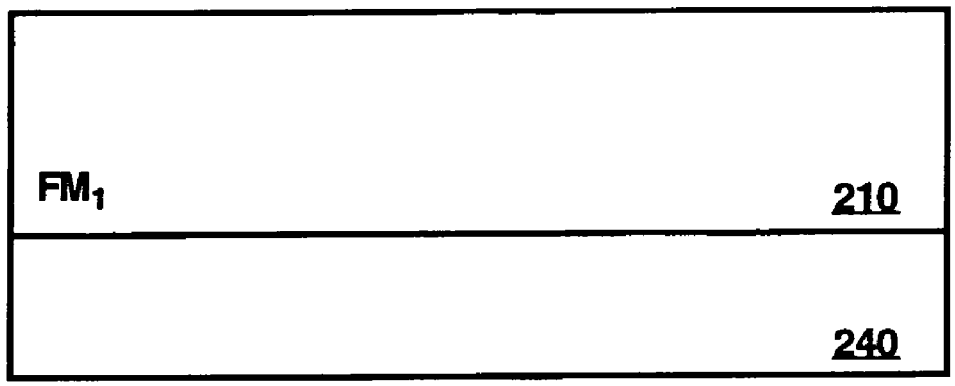
FIGS. 5A–5D illustrate an exemplary method of manufacturing the sensor shown in FIG. 2A.

FIGS. 5A–5D illustrate an exemplary method of manufacturing the sensor 200 shown in FIG. 2A. As shown in FIG. 5A, the substrate 240 may be formed. The substrate 240 may be planarized. Then the first magnetic layer 210 may be formed on the substrate 240. Material to form the first magnetic layer 210 may be deposited, sputtered, fired on the substrate 240. The first magnetic layer 210 may also be planarized.

Figure 5B:
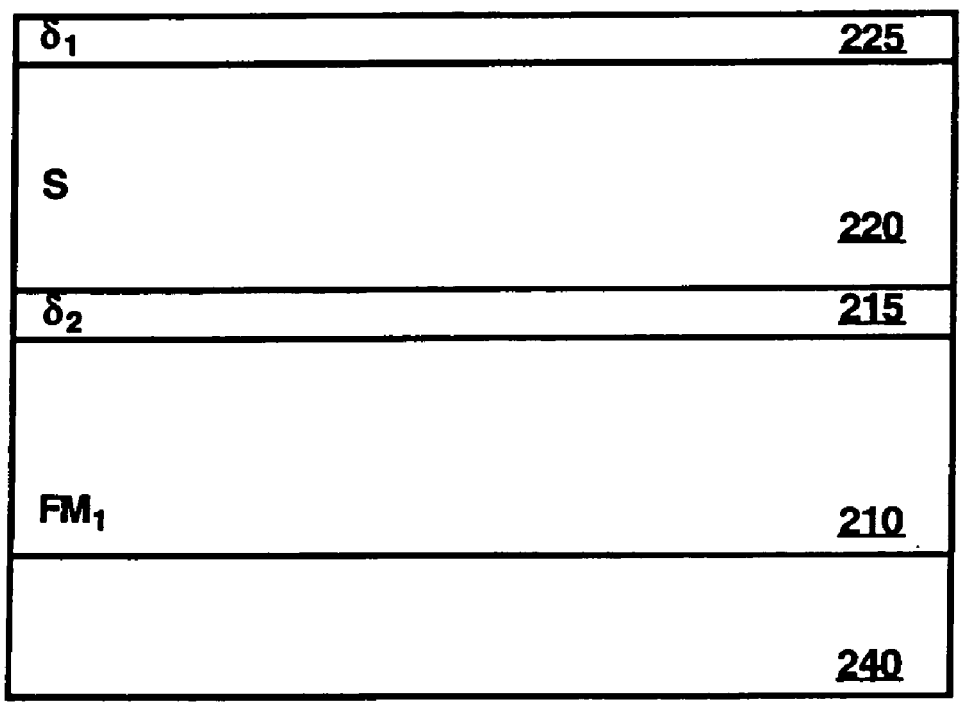

Then as shown in FIG. 5B, the first and second $\delta$-doped layers 215 and 225 and the semiconductor layer 220 may be formed. In one embodiment, the first $\delta$-doped layer 215 may be formed by epitaxial or molecular growth. The first $\delta$-doped layer 215 may also be deposited, sputtered, or fired onto the first magnetic layer 215. Then the semiconductor layer 220 may be deposited, fired, or sputtered onto the first $\delta$-doped layer 215. Then the second $\delta$-doped layer 225 may be formed by epitaxial or molecular growth, or may be deposited, sputtered, or fired onto the semiconductor layer. Note that each of the first and second $\delta$-doped layers 215 and 225 and the semiconductor layer 220 may be planarized. Also, the first and second $\delta$-doped layers 215 and 225 may be doped more heavily as compared to the semiconductor layer 220.

In another embodiment, the semiconductor layer 220 may be formed on the first ferromagnetic layer 210 and the first and second δ-doped layers 215 and 225 may be formed by heavily doping appropriate portions of the semiconductor 220.

Figure 5C:
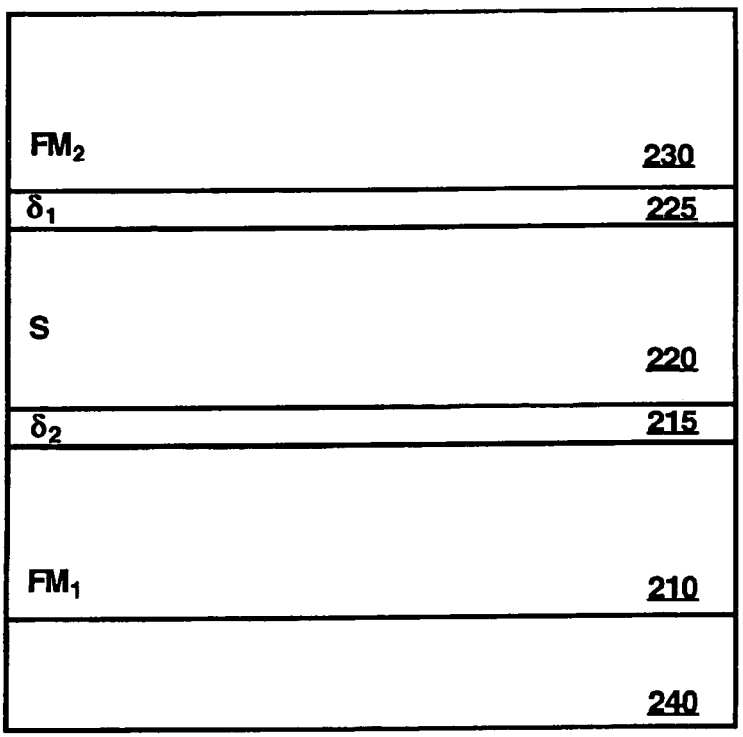

Then as shown in FIG. 5C, the second ferromagnetic layer 230 may be formed, again by epitaxial growth, or may be deposited, sputtered, or fired onto on the second δ-doped layer 225. The second magnetic layer 230 may be planarized.

Figure 5D:
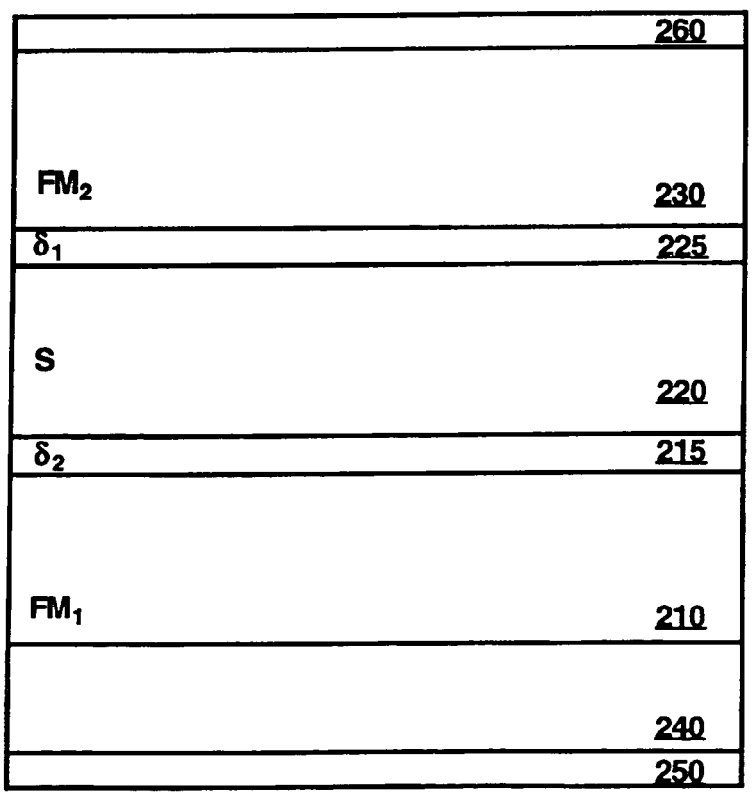
Figure 6A:
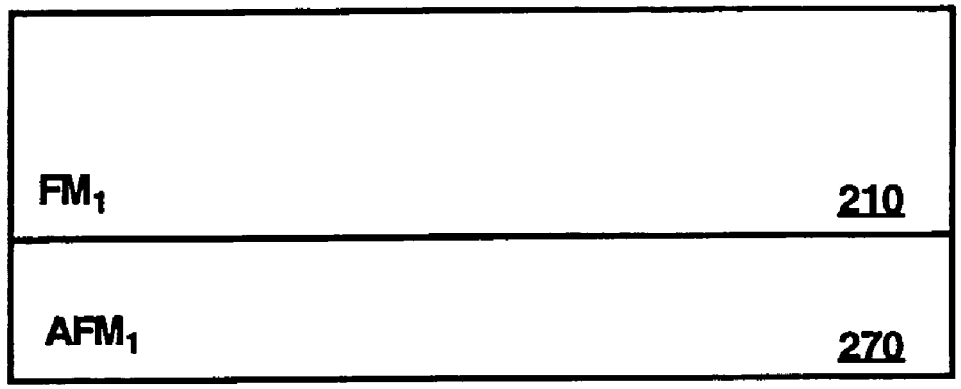
Figure 6B:
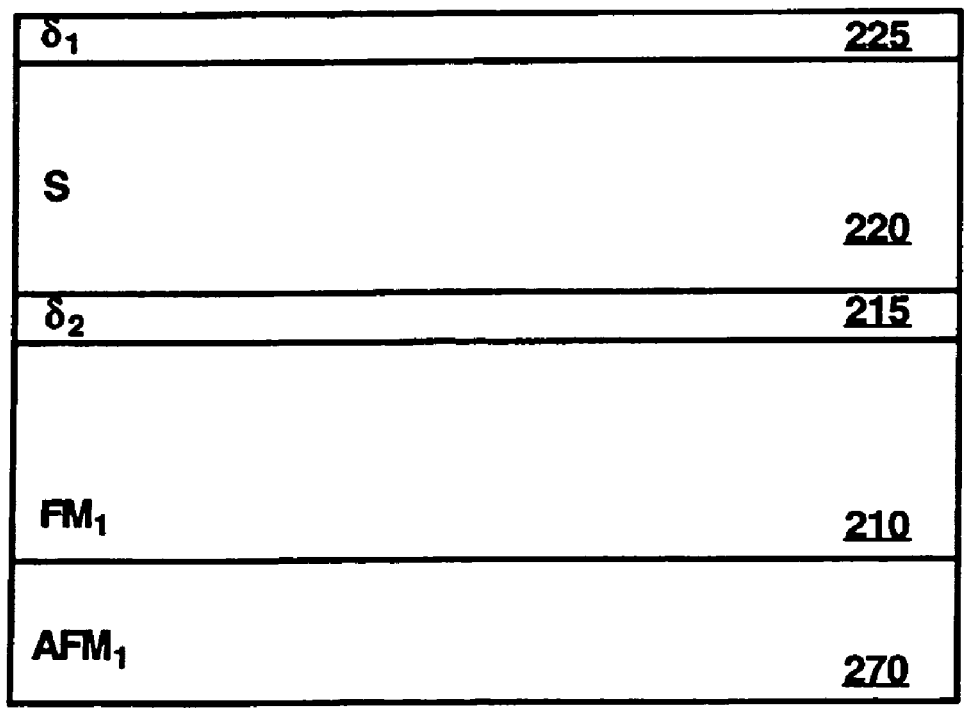
Figure 6D:
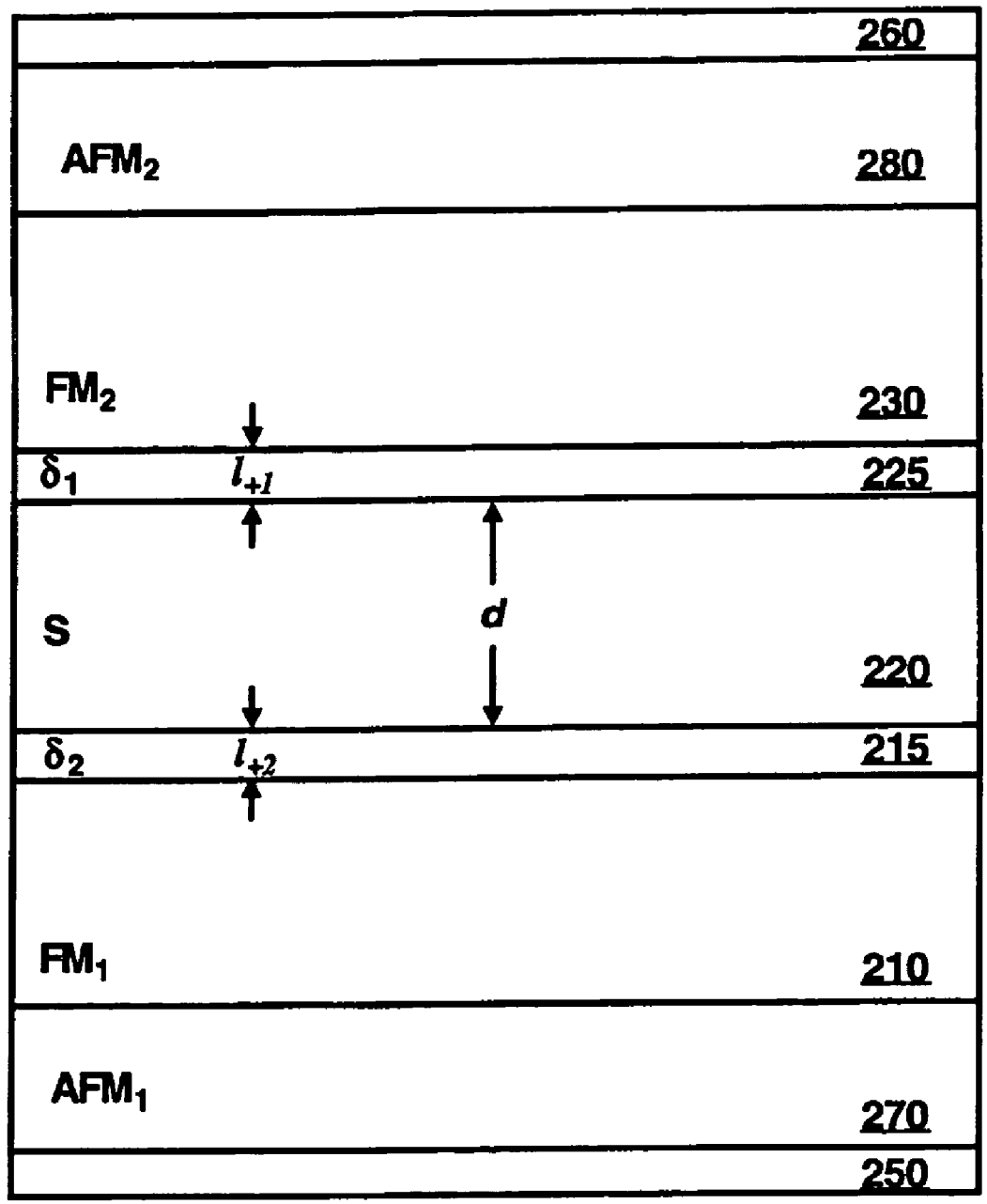

Then as shown in FIG. 5D, the first and second electrodes 250 and 260 may be formed by sputtering, firing, or depositing materials on the first and second ferromagnetic layers 210 and 230, respectively.

FIGS. 6A–6D illustrate an exemplary method of manufacturing the sensor 200-2 shown in FIG. 2B. The method to manufacture sensor 200-2 is similar to the method illustrated in FIGS. 5A–5D. Thus the details need not be repeated. However, the methods do differ in first and second antiferromagnetic layers 270 and 270 are formed and the substrate 240 is not.

What has been described and illustrated herein are preferred embodiments of the invention along with some of its variations. The terms, descriptions, and figures used herein are set forth by way of illustration only and are not meant as limitations. Many variations are possible within the spirit and scope of the invention, which is intended to be defined by the following claims—and their equivalents—in which all terms are meant in their broadest reasonable sense unless otherwise indicated.

What is claimed is:

1. A method for forming a magnetic sensor, comprising:
forming a first ferromagnetic layer;
forming a second ferromagnetic layer above the first ferromagnetic layer;
forming a semiconductor layer between the first and second ferromagnetic layers, wherein the semiconductor layer permits application from outside the magnetic sensor, of a magnetic field being sensed;
forming a first δ-doped layer between the first ferromagnetic layer and the semiconductor layer; and
forming a second δ-doped layer between the second ferromagnetic layer and the semiconductor layer, wherein
at least a selected one of the first and second δ-doped layers satisfies a condition $$N_d > 2\frac{\varepsilon_0\varepsilon(\Delta - \Delta_0)}{q^2 l^2},$$

wherein $N_d$ and l represent a donor concentration and a thickness of the selected δ-doped layer; q represents a positive elementary charge; $\varepsilon$ represents a relative permittivity of the semiconductor layer, $\varepsilon_0$ represents a permittivity of vacuum; Δ represents a potential barrier height on interfaces between the selected δ-doped layer and an adjacent one of the first and second ferromagnetic layers; and $\Delta_0$ represents a height of a potential barrier formed in the semiconductor layer.

2. The method of claim 1, further comprising forming a substrate such that the first ferromagnetic layer is on a surface of the substrate.

3. The method of claim 1, wherein at least one of the first ferromagnetic layer, the first δ-doped layer, the semiconductor layer, the second δ-doped layer, and the second ferromagnetic layer are formed by at least one of deposition, firing, and sputtering.

4. The method of claim 1, wherein at least one of the first δ-doped layer, the semiconductor layer, and the second δ-doped layer are formed by at least one of epitaxial growth and molecular growth.

5. The method of claim 1, wherein the step forming the first or the second δ-doped layer includes doping a portion of the semiconductor layer.

6. The method of claim 1, wherein:
the step forming the first δ-doped layer includes negatively doping the first δ-doped layer;
the step forming the second δ-doped layer includes negatively doping the second δ-doped layer; and
the step forming the semiconductor layer includes negatively doping the semiconductor layer.

7. The method of claim 1, wherein forming the semiconductor layer situates the semiconductor layer so that the magnetic field being sensed rotates spins of electrons passing through the semiconductor layer.

8. The method of claim 1, wherein the magnetic field sensed has a direction noncollinear with spins of spin-polarized electrons injected into the semiconductor layer from one of the first and second ferromagnetic layers.

9. The method of claim 1 wherein the potential barrier height $\Delta_0$ formed in the semiconductor layer corresponds to a peak in a density of minority d↓ electrons in at least one of the first ferromagnetic layer and the second ferromagnetic layer.

10. The method of claim 1 wherein the thickness l is less than or substantially equal to 1 nanometer and the donor concentration of $N_d$ is substantially equal to or greater than $10^{20}$ cm$^{-3}$.

11. A method for forming a magnetic sensor, comprising:
forming a first ferromagnetic layer;
forming a second ferromagnetic layer above the first ferromagnetic layer;
forming a semiconductor layer between the first and second ferromagnetic layers, wherein the semiconductor layer permits application from outside the magnetic sensor, of a magnetic field being sensed;
forming a first δ-doped layer between the first ferromagnetic layer and the semiconductor layer;
forming a second δ-doped layer between the second ferromagnetic layer and the semiconductor layer;
forming a first antiferromagnetic layer that adjacent to the first ferromagnetic layer to fix a first direction for a magnetization of the first ferromagnetic layer; and
forming a second antiferromagnetic layer adjacent to the second ferromagnetic layer to fix a direction for a magnetization of the second ferromagnetic layer.

12. The method of claim 11, wherein at least one of the first ferromagnetic layer, the first δ-doped layer, the semiconductor layer, the second δ-doped layer, and the second ferromagnetic layer are formed by at least one of deposition, firing, and sputtering.

13. The method of claim 11, wherein at least one of the first δ-doped layer, the semiconductor layer, and the second δ-doped layer are formed by at least one of epitaxial growth and molecular growth.

14. The method of claim 11, wherein the step forming the first or the second δ-doped layer includes doping a portion of the semiconductor layer.

15. The method of claim 11, wherein:
the step forming the first δ-doped layer includes negatively doping the first δ-doped layer;
the step forming the second δ-doped layer includes negatively doping the second δ-doped layer; and
the step forming the semiconductor layer includes negatively doping the semiconductor layer.

* * * * *

UNITED STATES PATENT AND TRADEMARK OFFICE
CERTIFICATE OF CORRECTION

PATENT NO. : 7,094,610 B2  Page 1 of 1
APPLICATION NO. : 10/879649
DATED : August 22, 2006
INVENTOR(S) : Viatcheslav V. Osipov et al.

It is certified that error appears in the above-identified patent and that said Letters Patent is hereby corrected as shown below:

In column 3, line 62, delete "N," and insert -- $N_s$ --, therefor.

In column 7, line 63, delete "spin a" and insert -- spin $\sigma$ --, therefor.

In column 10, line 24, delete "$d\downarrow$" and insert -- d --, therefor.

Signed and Sealed this

Twenty-fourth Day of November, 2009

David J. Kappos
*Director of the United States Patent and Trademark Office*